(12) United States Patent
Ishii et al.

(10) Patent No.: US 8,154,026 B2
(45) Date of Patent: Apr. 10, 2012

(54) SILICON CARBIDE BIPOLAR SEMICONDUCTOR DEVICE

(75) Inventors: Ryosuke Ishii, Osaka (JP); Koji Nakayama, Osaka (JP); Yoshitaka Sugawara, Osaka (JP); Toshiyuki Miyanagi, Yokosuka (JP); Hidekazu Tsuchida, Yokosuka (JP); Isaho Kamata, Yokosuka (JP); Tomonori Nakamura, Yokosuka (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 644 days.

(21) Appl. No.: 12/097,019

(22) PCT Filed: Dec. 13, 2006

(86) PCT No.: PCT/JP2006/324818
§ 371 (c)(1),
(2), (4) Date: Jun. 11, 2008

(87) PCT Pub. No.: WO2007/069632
PCT Pub. Date: Jun. 21, 2007

(65) Prior Publication Data
US 2009/0045413 A1 Feb. 19, 2009

(30) Foreign Application Priority Data
Dec. 14, 2005 (JP) .................. 2005-360245

(51) Int. Cl.
*H01L 29/15* (2006.01)

(52) U.S. Cl. .................. 257/77; 257/E29.104
(58) Field of Classification Search .................. 257/77, 257/E29.104
See application file for complete search history.

(56) References Cited

U.S. PATENT DOCUMENTS
5,449,925 A 9/1995 Baliga et al.
(Continued)

FOREIGN PATENT DOCUMENTS
JP 52131478 A 11/1977
(Continued)

OTHER PUBLICATIONS

Das, Mrinal K. et al., "Ultra High Power 10 kV, 50 A SiC PiN Diodes", Proceedings of the 17th International Symposium on Power Semiconductor Devices & IC's, May 23-26, 2005, Santa Barbara, CA, 4 pages.

(Continued)

*Primary Examiner* — Howard Weiss
*Assistant Examiner* — Steven Rao
(74) *Attorney, Agent, or Firm* — The Webb Law Firm

(57) ABSTRACT

In a SiC bipolar semiconductor device with a mesa structure having a SiC drift layer of a first conductive type and a SiC carrier injection layer of a second conductive type that are SiC epitaxial layers grown from a surface of a SiC single crystal substrate, the formation of stacking faults and the expansion of the area thereof are prevented and thereby the increase in forward voltage is prevented. Further, a characteristic of withstand voltage in a reverse biasing is improved. An forward-operation degradation preventing layer is formed on a mesa wall or on a mesa wall and a mesa periphery to separate spatially the surface of the mesa wall from a pn-junction interface. In one embodiment, the forward-operation degradation preventing layer is composed of a silicon carbide low resistance layer of a second conductive type that is equipotential during the application of a reverse voltage. In another embodiment, the forward-operation degradation preventing layer is composed of a silicon carbide conductive layer of a second conductive type, and a metal layer that is equipotential during the application of a reverse voltage is formed on a surface of the silicon carbide conductive layer. In still another embodiment, the forward-operation degradation preventing layer is composed of a high resistance amorphous layer.

20 Claims, 12 Drawing Sheets

U.S. PATENT DOCUMENTS

| | | | |
|---|---|---|---|
| 5,914,499 | A | 6/1999 | Hermansson et al. |
| 6,417,526 | B2 | 7/2002 | Brown et al. |
| 6,716,714 | B1 | 4/2004 | Goebel et al. |
| 2002/0018029 | A1* | 2/2002 | Koyama .................... 345/39 |
| 2005/0156284 | A1 | 7/2005 | Schmidt |
| 2005/0218425 | A1 | 10/2005 | Andoh |

FOREIGN PATENT DOCUMENTS

| | | | |
|---|---|---|---|
| JP | 10107299 | A | 4/1998 |
| JP | 2002185015 | A | 6/2002 |
| JP | 2005317894 | A | 11/2005 |
| WO | 9622610 | A1 | 7/1996 |
| WO | 9953553 | A2 | 10/1999 |
| WO | 0113434 | A1 | 2/2001 |
| WO | 0249114 | A2 | 6/2002 |
| WO | WO 02049114 | * | 6/2002 |

OTHER PUBLICATIONS

Losee, P.A. et al., "High-Voltage 4H-SiC PiN Rectifiers with Single-Implant, Multi-Zone JTE Termination", Proceedings of 2004 International Symposium on Power Semiconductor Devices & IC's, Kitakyushi, pp. 301-304.

Technology of Semiconductor SiC and Its Application, edited and written by Matsunami Hiroyuki, Mar. 31, 2003, pp. 218-221, published by The Nikkan Kogyo Shimbun, Ltd., with partial translation (9 pp.).

Agarwal, AK. K. et al., "Dynamic Performance of 3.1 kV 4H-SiC Assymmetrical GTO Thyristors", Materials Science Forum, vols. 389-393 (2002), pp. 1349-1352 (4 pp.).

Lendenmann, H. et al., "4.5kV 4H-SiC diodes with ideal forward characteristic", Extended Abstracts of International Symposium on Silicon Carbide, III-Nitride and Related Materials, 2001 (4 pp.).

Nakayama, K. et al., "8.3 kV 4H-SiC pin Diode on (000-1) C-face with Small Forward Voltage Degradation", Materials Science Forum, vols. 483-485 (2005), pp. 969-972 (4 pp.).

Jacobson, H. et al., "Properties and origins of different stacking faults that cause degradation in SiC PiN diodes", Journal of Applied Physics, vol. 95, No. 3, Feb. 1, 2004, pp. 1485-1488 (4 pp.).

Skowronski, M. et al., "Recombination-enhanced defect motion in forward-biased 4H-SiC p-n diodes", Journal of Applied Physics, vol. 92, No. 8, Oct. 15, 2002, pp. 4699-4704 (6 pp.).

Ha, S. et al., "Dislocation nucleation in 4H silicon carbide epitaxy", Journal of Crystal Growth, vol. 262, (2004), pp. 130-138 (9 pp.).

* cited by examiner (a)

(b)

(a)

(b)

(c)

(d)

Prior Art

Prior Art

SILICON CARBIDE BIPOLAR SEMICONDUCTOR DEVICE

TECHNICAL FIELD

The present invention relates to a silicon carbide bipolar semiconductor device with a mesa structure, particularly to an improvement in the art of preventing the formation and expansion of stacking faults during a current passage, and to an improvement in the art of enhancing the withstand voltage when a reverse voltage is applied.

BACKGROUND ART

Wide gap semiconductor materials are excellent in dielectric breakdown electric field strength, about 10 times as high as that of silicon, and receive attention as a material suited for high withstand voltage power semiconductor devices having high withstand voltage characteristics.

Bipolar semiconductor devices such as pn-diodes, bipolar transistors, GTO and GCT have a higher built-in voltage than unipolar semiconductor devices such as Schottky diodes and MOSFET, but have a resistance that is greatly lowered by the conductivity modulation of a drift layer caused by minority carrier injection. Therefore, in the field of high voltage and high current such as power application, the bipolar semiconductor devices are used to reduce power loss.

When these bipolar semiconductor devices are made of SiC, extraordinarily excellent performance can be attained as compared with Si devices. For example, a SiC pn-diode with a withstand voltage of 10 kV provides various advantages over a pn-diode made of Si; that is, the forward voltage is about ⅓, the reverse recovery time that corresponds to an off-time speed is about 1/20 or less, and the power loss is about ⅕ or lower as compared with a Si pn-diode, thereby greatly contributing to energy saving.

Reduction in power loss has been also reported for SiC bipolar devices other than the SiC pn-diodes, such as SiC npn-transistors, SiC SIAFET and SiC SIJFET (Non-Patent Document 1). Besides these devices, SiC GTO having as a drift layer a p-type semiconductor layer with a reverse polarity has also been disclosed (Non-Patent Document 2).

As a conventional pn-diode using SiC, there may be mentioned a high voltage diode with a planar structure as shown in FIG. 14 (Non-Patent Document 3). The withstand voltage of this pn-diode is about 3.4 kV. In this pn-diode, a SiC single crystal $n^+$ substrate 1 has a cathode 5 on one face thereof, a n-type drift layer 2 is formed on the other face of the substrate, and a p-type carrier injection layer 3 is formed at a central part of the n-type drift layer 2. On both sides of the p-type carrier injection layer 3, a p-type layer 51 for termination is formed.

The "termination" in a high voltage semiconductor device denotes various kinds of semiconductor layers that are formed around a pn-junction through which a current flows, to reduce the electric field concentration around the pn-junction in a reverse biasing. In the pn-diode shown in FIG. 14, the pn-junction through which a current flows and the pn-junction between the termination p-type layer 51 which reduces the electric-field concentration and the n-type drift layer 2 are formed by ion implantation of boron, aluminum or the like.

As another example of the high voltage diodes using SiC, there may be mentioned a diode with a structure shown in FIG. 15 (Non-Patent Document 4). The withstand voltage of this pn-diode is 8.3 kV. In this pn-diode, the pn-junction between a p-type carrier injection layer 3 which injects carriers to a n-type drift layer 2 and the n-type drift layer 2 is formed by epitaxial growth, and then a mesa structure is formed by reactive ion etching to perform device separation.

To form the mesa structure in this pn-diode, both ends of a p-type carrier injection layer 3 that is formed in about 2 μm thickness on the entire surface of a n-type drift layer 2 are mesa-etched to a depth of 4 μm. After the mesa structure is formed, a p-type layer 52 for termination which reduces the electric field concentration is formed. The surface of the device is protected with a silicon dioxide layer (passivation layer 4) except a portion where an anode 6 is formed.

Non-Patent-Document 1: "Handoutai SiC Gijutsu To Ouyou (Semiconductor SiC technology and applications)" edited and written by Matsunami Hiroyuki, pages 218 to 221, published by THE NIKKAN KOGYO SHIMBUN, LTD, Mar. 31, 2003;

Non-Patent Document 2: Materials Science Forum, Volumes 389 to 393, pages 1349 to 1352, year 2000;

Non-Patent Document 3: Extended Abstracts of International Conference on Silicon Carbide, III-Nitride and Related Materials, pages 136 to 137, year 1997;

Non-Patent Document 4: Materials Science Forum, Volumes 483 to 485, pages 969 to 972, year 2005;

Non-Patent Document 5: Journal of Applied Physics, Volume 95, No. 3, pages 1485 to 1488, year 2004;

Non-Patent Document 6: Journal of Applied Physics, Volume 92, No. 8, pages 4699 to 4704, year 2004; and Non-Patent Document 7: Journal of Crystal Growth, Volume 262, pages 130 to 138, year 2004.

DISCLOSURE OF THE INVENTION

In the case of the pn-diode with a planar structure shown in FIG. 14, the p-type carrier injection layer 3 is formed by ion implantation, and therefore crystal defects are formed in and around the p-type carrier injection layer 3. Due to this, the carrier injection efficiency in forward biasing (where the anode 6 is biased positive) is low and the on-voltage is relatively high. In addition, a leakage current is large in a reverse biasing. Therefore, it is difficult to realize a high voltage semiconductor device with a low loss.

On the other hand, in the pn-diode with a mesa structure shown in FIG. 15, crystal defects are less as compared with the pn-diode shown in FIG. 14 because the p-type carrier injection layer 3 is formed by epitaxial growth. Due to this, the efficiency of a carrier injection in forward biasing is relatively high and the on-voltage is relatively low.

However, in the bipolar semiconductor device with a mesa structure, defects, roughening or the like develop on the mesa wall face and the surface of a mesa periphery when the mesa is formed. In reverse biasing, an electric field is concentrated at these defects, roughening or the like, increasing of leakage current.

FIG. 16 shows a light emission image obtained by an emission microscope when a reverse bias is applied to the mesa pn-diode shown in FIG. 15. Light emission is observed on the surface of the mesa wall, which indicates that leakage current is caused on the surface of the mesa wall.

Further, in the pn-diode shown in FIG. 15, the n-type drift layer 2 and the p-type carrier injection layer 3 are formed by epitaxial growth. In the step of epitaxially growing these layers on the surface of the SiC single crystal substrate ($n^+$ substrate 1), part of basal plane dislocation in the $n^+$ substrate 1 is continuously propagated to the SiC epitaxial layers.

When a bipolar device such as a pn-diode is operated with a forward bias, electrons and holes are recombined in a region near the interface between a n-type drift layer and a p-type carrier injection layer. The basal plane dislocations form stacking faults and the stacking faults are expanded by the recombination energy of the electrons and holes generated during the forward-operation (refer to the aforementioned Non-Patent Documents 5 to 7). These stacking faults are generated in the form of planer defects having a shape such as triangle, and the area thereof increases with increasing forward-operation time.

Particularly, the mesa wall face and the surface of the mesa periphery have defects and roughening caused in the mesa formation, and the recombination of carriers in the vicinity of these surfaces is very likely to cause the formation of stacking faults from the basal plane dislocations and the expanding of the stacking faults.

The stacking faults act as high resistance regions when a forward current is applied, and therefore the expansion of the stacking faults causes an increase in the forward voltage in the bipolar device.

It is an object of the present invention to suppress the formation and expansion of stacking faults and thereby to suppress the increase in forward voltage in a silicon carbide bipolar semiconductor device with a mesa structure.

It is another object of the present invention to increase a performance of withstand voltage when a reverse voltage is applied to a silicon carbide bipolar semiconductor device with a mesa structure.

SUMMARY OF THE INVENTION

A bipolar semiconductor device of the present invention comprises:

a silicon carbide drift layer of a first conductive type formed on a surface of a silicon carbide single crystal substrate by epitaxial growth;

a silicon carbide carrier injection layer of a second conductive type formed on a surface of the silicon carbide drift layer by epitaxial growth;

a mesa structure formed on an device face on the side where the silicon carbide drift layer and the silicon carbide carrier injection layer are formed; and a forward-operation degradation preventing layer formed on a mesa wall or on a mesa wall and a mesa periphery to separate spatially the surface of the mesa wall from a pn-junction interface.

In this way, the forward-operation degradation preventing layer is formed on the mesa wall or on the mesa wall and mesa periphery, and the pn-junction interface is separated spatially from the surface of the mesa wall by the presence of the forward-operation degradation preventing layer, so that there is no pn-junction interface on the surface of the mesa wall.

Therefore, electrons and holes recombination do not occur on the surface of the mesa wall, so that it is possible to substantially suppress the formation and expansion of stacking faults thereof caused by defects and roughening on the surface of the mesa wall and mesa periphery. As a result, increase in forward voltage is suppressed, and loss is lowered.

The forward-operation degradation preventing layer is formed in a region ranging at least from the pn-junction interface to the mesa end on the mesa wall. By this configuration, the pn-junction interface between the silicon carbide drift layer and the silicon carbide carrier injection layer is separated from the surface of the mesa wall by the presence of the forward-operation degradation preventing layer.

Preferably, the forward-operation degradation preventing layer is formed on the whole of the mesa wall in the height direction thereof. By this configuration, the electric field concentration on the surface of the mesa wall can be prevented when the forward-operation degradation preventing layer functions as an equipotential layer during application of a reverse voltage as described later.

The forward-operation degradation preventing layer can be formed by ion implantation. Specifically, the forward-operation degradation preventing layer can be composed of a silicon carbide conductive layer of a second conductive type by ion implantation, or an amorphous layer that is formed by transforming a silicon carbide single crystal into an amorphous state by ion implantation.

Here, the thickness and impurity concentration of the silicon carbide conductive layer of a second conductivity type may be selected such that the thickness of the silicon carbide conductive layer of a second conductivity type is sufficiently larger than the diffusion distance of minority carriers diffusing from the silicon carbide drift layer of a first conductivity type to the silicon carbide conductive layer of a second conductivity type. The interface between the silicon carbide conductive layer of a second conductivity type and the silicon carbide carrier injection layer of a second conductivity type is generally defined by a difference in impurity concentration. However, it is not always necessary that the interface between the silicon carbide conductive layer and the silicon carbide carrier injection layer is clearly defined.

In the case where the forward-operation degradation preventing layer is a silicon carbide conductive layer of a second conductive type formed by ion implantation, the impurity concentration of the silicon carbide conductive layer of a second conductive type is equal to or higher than that of the carrier injection layer of a second conductive type (or the silicon carbide conductive layer of a second conductive type is not sufficiently low), carrier injection occurs from the silicon carbide conductive layer of a second conductive type to the drift layer of a first conductive type when a forward voltage is applied (that is, the silicon carbide conductive layer works as a carrier injection layer). Therefore, in this case, an inside silicon carbide conductive layer of a second conductive type is formed on the inner side of the silicon carbide conductive layer of a second conductive type so as to avoid carrier injection from the silicon carbide conductive layer of a second conductive type to the drift layer of a first conductive type.

In this case, it is desirable that the impurity concentration of the inside silicon carbide conductive layer is sufficiently lower than that of the carrier injection layer of a second conductive type.

In the case where the forward-operation degradation preventing layer is a silicon carbide conductive layer of a second conductive type formed by ion implantation and an impurity concentration of the layer is sufficiently high, the layer acts as a silicon carbide low resistance layer. The silicon carbide low resistance layer is substantially equipotential during the application of a reverse voltage because of its low resistance. Here, "substantially equipotential" includes the case where only the surface side of the silicon carbide low resistance layer is equipotential and also includes the case where the potential difference is sufficiently small such that the electric field concentration on the surface of the mesa wall and mesa periphery is prevented.

By providing the silicon carbide low resistance layer, the surface potential on the mesa wall and mesa periphery is equipotential as a whole during the application of a reverse voltage. As a result, there is no electric field distribution throughout the layer, and the leakage current flow through the surface of the mesa wall or mesa periphery is suppressed during the application of a reverse voltage. In detail, the electric field concentration caused by the defects and roughening on the mesa wall or in the vicinity of the mesa end is prevented, whereby it is possible to suppress the lowering in withstand voltage and the generation of leakage current caused by these defects and roughening.

In addition, by appropriately selecting the thickness and impurity concentration of the inside silicon carbide conductive layer of a second conductive type adjacent to the inner side of the silicon carbide low resistance layer, a depletion layer developed during the application of a reverse voltage can be confined inside the inside silicon carbide conductive layer. Consequently, the silicon carbide low resistance layer is equipotential as a whole and can sufficiently function as the forward-operation degradation preventing layer and also as an equipotential layer.

In the case where the forward-operation degradation preventing layer is a silicon carbide conductive layer of a second conductive type formed by ion implantation, it is preferable that a metal layer is formed on a surface of the forward-operation degradation preventing layer.

By forming the metal layer, the surface potential of the mesa wall or mesa periphery becomes equipotential as a whole during the application of a reverse voltage. As a result, no electric field distribution develops throughout the metal layer, and the current flow through the surface of the mesa wall or mesa periphery is suppressed during the application of a reverse voltage. In detail, the electric field concentration caused by the defects and roughening on the mesa wall or in the vicinity of the mesa end is prevented, whereby it is possible to suppress the lowering in withstand voltage and the generation of leakage current caused by these defects and roughening.

Further, the forward-operation degradation preventing layer is preferably an amorphous layer formed by ion implantation.

Because the amorphous layer formed by ion implantation into silicon carbide single crystal is of high resistance, electric field distribution exists on the surface of the mesa wall. However, because of the high resistance, the current flow through the surface of the mesa wall or mesa periphery is suppressed during the application of a reverse voltage. In detail, the electric field concentration caused by the defects and roughening on the mesa wall or in the vicinity of the mesa end is prevented, whereby it is possible to suppress the lowering in withstand voltage and the generation of leakage current caused by these defects and roughening.

In the invention, an electric field buffer layer of a second conductive type is preferably formed in the mesa periphery.

The electric field buffer layer is preferably formed continuously from the forward-operation degradation preventing layer.

Further, in one embodiment of the electric field buffer layer, the electric field buffer layer is composed of plural circular layers that are disposed successively in a radial direction and differ from one another in concentration of an impurity of a second conductive type.

Further, the electric field buffer layer preferably has a JTE (junction termination extension) structure.

By forming the electric field buffer layer, a depletion layer spreads outside during the application of a reverse voltage, and thereby a performance of withstand voltage is further improved.

Adjacent to an outer circumference of the electric field buffer layer, a second forward-operation degradation preventing layer of a first conductive type is preferably formed by ion implantation.

By forming the layer of a first conductive type adjacent to an outer circumference of the electric field buffer layer by ion implantation, the pn-junction interface in the outer circumference of the electric field buffer layer is separated spatially from a surface defect region present on the surface of the mesa periphery. As a result, carrier recombination does not occur in the surface defect region in the mesa periphery, so that the formation and expansion of stacking faults thereof caused by the defects on the surface of the mesa periphery are suppressed.

EFFECTS OF THE INVENTION

According to the silicon carbide bipolar semiconductor devices of the present invention, the formation of stacking faults and the expansion of the area thereof caused by forward-operation are prevented, and thereby the increase in forward voltage is suppressed.

In addition, the silicon carbide bipolar semiconductor devices of the present invention have a high performance of withstand voltage during the application of a reverse voltage.

Figure 1:
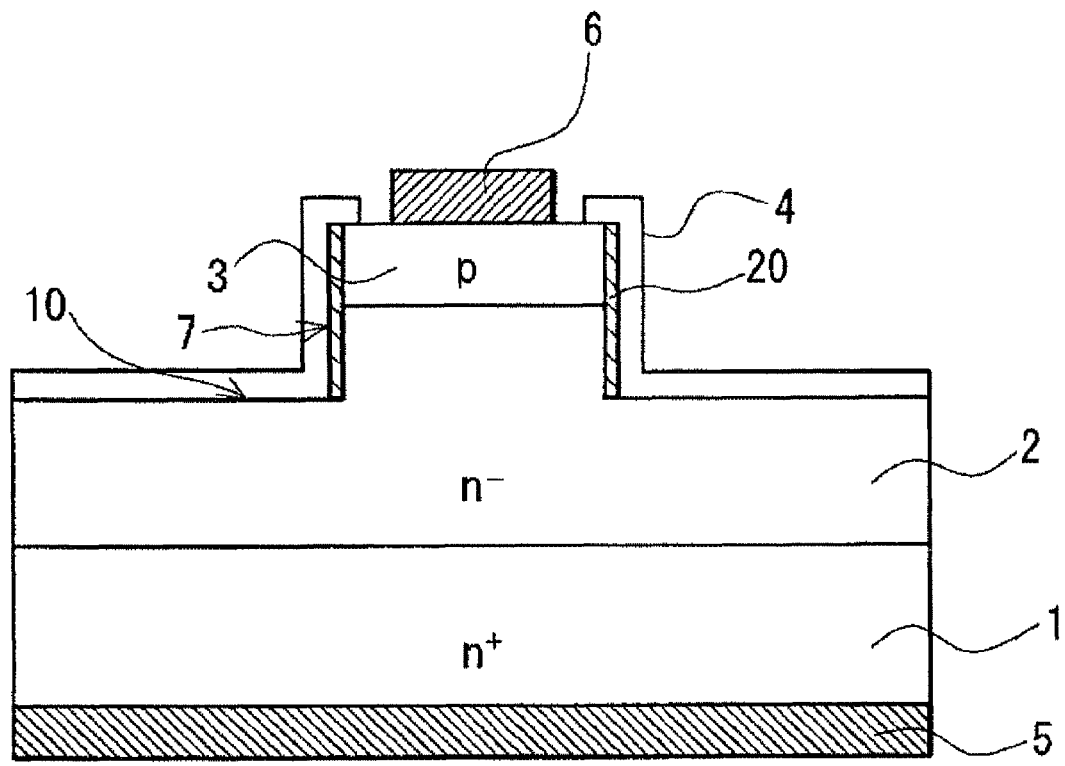
FIG. 1 is a cross-sectional view illustrating a first exemplary embodiment of a bipolar semiconductor device according to the present invention.

1: $n^+$ substrate
2: n-type drift layer
3: p-type carrier injection layer
4: passivation layer
5: cathode
6: anode
7: mesa wall
8: mesa end
9: mesa top
10: mesa periphery
11: p-type low resistance layer
12: metal layer
13: amorphous layer
20: p-type conductive layer
21: p-type conductive layer
22: p-type conductive layer
31: electric field buffer layer
31a to 31g: p-type termination
41: n-type layer
42: contact layer
43: pn-junction interface
44: surface defect region

BEST MODE FOR CARRYING OUT THE INVENTION

Hereinafter, the present invention will be further explained with reference to the accompanied drawings. FIG. 1 is a cross-sectional view illustrating the first exemplary embodiment of a silicon carbide bipolar semiconductor device (pn-diode) according to the present invention. In the pn-diode of the exemplary embodiment, a $n^+$ substrate 1 is a n-type SiC single crystal substrate with a high impurity concentration, and a n-type drift layer 2 with a lower impurity concentration is formed on the substrate by epitaxial growth.

On the n-type drift layer 2, a p-type carrier injection layer 3 with a low impurity concentration is formed by epitaxial growth.

A region in which current passes from the p-type carrier injection layer 3 to the n-type drift layer 2 through a pn-junction interface is separated from surrounding areas by a table-shaped mesa structure. This mesa structure is formed by etching the epitaxially grown n-type drift layer 2 and p-type carrier injection layer 3 by reactive ion etching that is one of mesa etching techniques.

Figure 12:
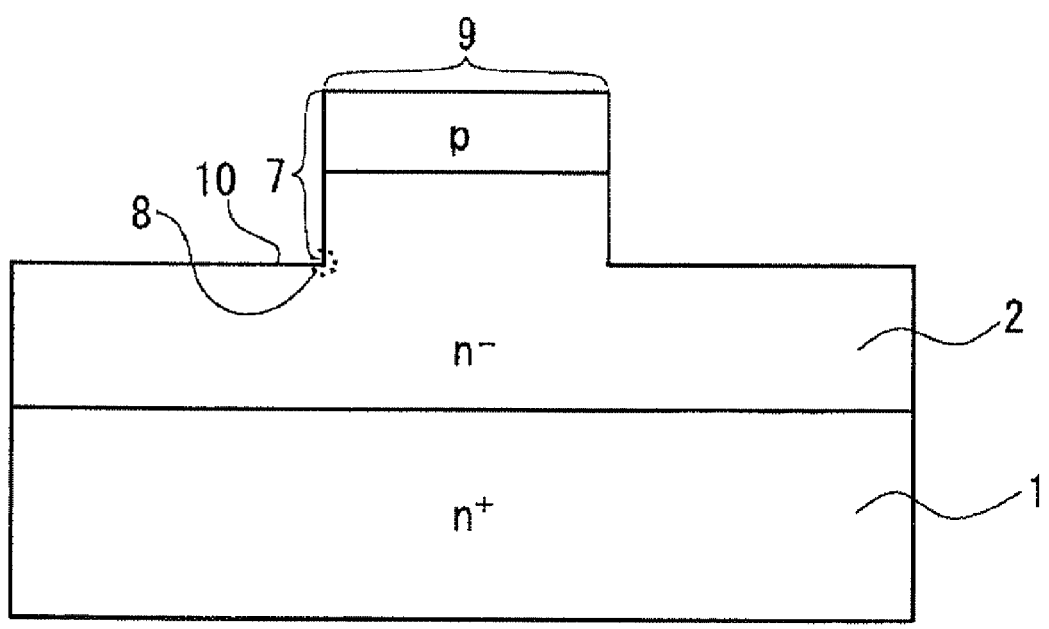
FIG. 12 is a cross-sectional view illustrating a mesa structure.

Note that, in the following description, as shown in FIG. 12, the "mesa wall" denotes a region (reference mark: 7) from the circumference face of the mesa-shape to the vicinity of the inside of the mesa shape; the "mesa end" denotes the lower end (reference mark: 8) of a mesa wall 7; and the "mesa periphery" denotes a region (etched bottom face, reference mark: 10) on the horizontal face in the periphery of the mesa that extends from an outer position from a mesa end 8 to the vicinity of the inside of the mesa shape.

In the present exemplary embodiment, as shown in FIG. 1, a p-type conductive layer 20 is formed on the whole of the mesa wall 7. The p-type conductive layer 20 is formed by ion implantation of boron, aluminum or the like. After the ion implantation, the layer is subjected to thermal treatment at 1800° C. in an argon gas atmosphere to activate the implanted ions.

The surface of the device is protected with a passivation layer 4 except the region where an anode 6 is formed. The passivation layer 4 may be made of a silicon dioxide layer prepared by thermal oxidation, but, besides silicon dioxide, may be made of silicon nitride or the like.

On the top face of the mesa, the anode 6 is formed. The anode 6 is formed, for example, as follows: the passivation layer 4 that is formed on the surface of the device by thermal oxidation is treated to remove a portion where the anode 6 will be formed; Al, Ni or the like is then deposited on the surface of the p-type carrier injection layer 3 with an electron beam evaporator; and thermal treatment is performed.

On the rear face of the device on the side of the $n^+$ substrate 1, a cathode 5 is formed. The cathode 5 is formed, for example, as follows: a layer that is formed on the rear face of the device by thermal oxidation in the production of the passivation layer 4 on the front face of the device, is removed from the $n^+$ substrate 1; nickel or the like is then deposited with an electron beam evaporator; and thermal treatment is performed.

Specific examples of the dimensions, impurity concentration and others of the pn-diode according to the present exemplary embodiment are as follows. Here, the cross-sectional views of the pn-diodes shown in FIG. 1 and the other figures are only explanatory. The actual dimensions and others are as recognized by those skilled in the art based on the present description and conventional technologies:

$n^+$ substrate 1: thickness 350 μm, impurity concentration $7.5 \times 10^{18}$ cm$^{-3}$, n-type drift layer 2: thickness 60 μm, impurity concentration $5 \times 10^{14}$ cm$^{-3}$, p-type carrier injection layer 3: thickness 2 μm, impurity concentration $3 \times 10^{18}$ cm$^{-3}$, height of mesa wall 7: 4 μm, and p-type conductive layer 20: thickness 640 nm, impurity concentration $1.5 \times 10^{17}$ cm$^{-3}$.

The p-type conductive layer 20 functions as an forward-operation degradation preventing layer that separates the surface of the mesa wall 7 spatially from the pn-junction interface. By providing the p-type conductive layer 20, recombination between electrons and holes on the surface of the mesa wall 7 is prevented. As a result, the formation and expansion of stacking faults thereof caused by the defects and roughening on the surface of the mesa wall 7 are substantially suppressed.

In the mesa wall, the p-type conductive layer 20 is formed in a region ranging at least from the pn-junction interface between the n-type drift layer 2 and the p-type injection layer 3 to the mesa end. As a result, the pn-junction interface is separated from the surface of the mesa wall 7 by the presence of the p-type conductive layer 20.

If necessary, the p-type conductive layer 20 may be formed continuously from the mesa wall 7 to a mesa periphery 10 in the vicinity of the mesa wall. As a result, in the mesa periphery 1 in the vicinity of the mesa end, the surface thereof is separated spatially from the pn-junction interface, so that recombination of electrons and holes is prevented on the surface of the mesa periphery 10.

The thickness of the p-type conductive layer 20 is preferably from 200 nm to 1 μm, and more preferably from 500 nm to 1 μm.

Further, the impurity concentration of the p-type conductive layer 20 is preferably $10^{18}$ cm$^{-3}$ or less, more preferably from $1 \times 10^{17}$ cm$^{-3}$ to $5 \times 10^{17}$ cm$^{-3}$, and still more preferably from $1 \times 10^{17}$ cm$^{-3}$ to $2 \times 10^{17}$ cm$^{-3}$.

Figure 2:
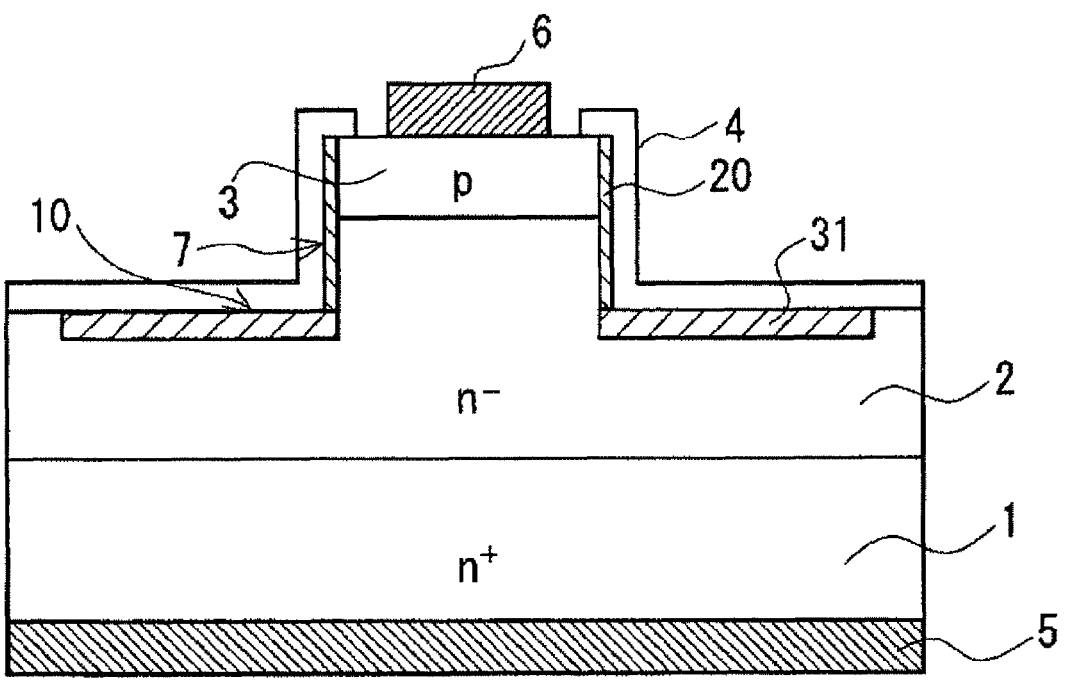
FIG. 2 is a cross-sectional view illustrating a second exemplary embodiment of a bipolar semiconductor device according to the present invention.

FIG. 2 is a cross-sectional view illustrating the second exemplary embodiment of a silicon carbide bipolar semiconductor device (pn-diode) according to the present invention. The constituent devices that appear in the first exemplary embodiment are shown with the same reference marks, and detailed explanation thereof is omitted.

In the present exemplary embodiment, the configuration thereof is basically similar to that in the first exemplary embodiment, but an electric field buffer layer 31 is formed in the mesa periphery 10. The electric field buffer layer 31 is formed by ion implantation of a p-type impurity.

By forming the electric field buffer layer 31, a depletion layer spreads over a region where the electric field buffer layer 31 is formed during the application of a reverse voltage. The depletion layer further enhances the performance of withstand voltage.

The electric field buffer layer 31 is formed as a circle around the mesa. Further, the electric field buffer layer 31 is preferably formed continuously from the p-type conductive layer 20.

In one exemplary embodiment of the electric field buffer layer 31, the electric field buffer layer 31 is composed of plural circular layers that are disposed successively in a radial direction and differ from one another in concentration of p-type impurity. Particularly preferably, the electric field buffer layer has a JTE (junction termination extension) structure.

Figure 3:
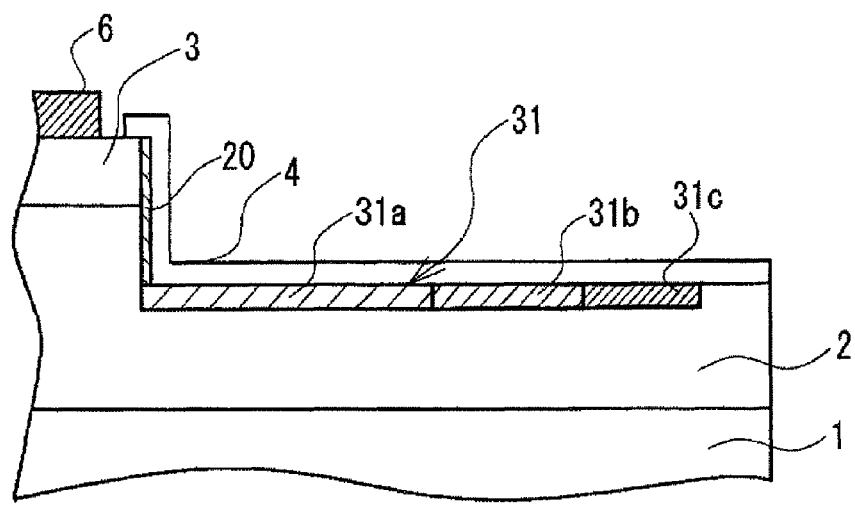
FIGS. 3(a) and (b) are a set of cross-sectional views illustrating examples of electric field buffer layers.
Figure 3:
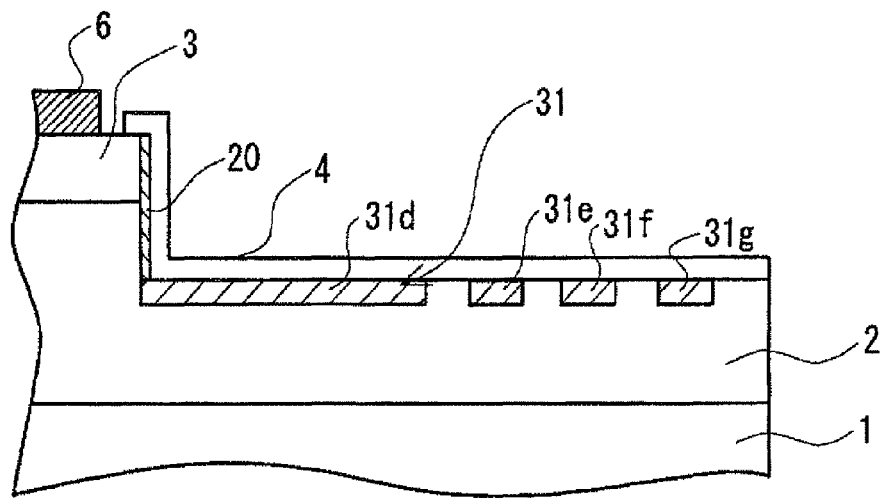

One specific example of structures of the electric field buffer layer 31 is shown in FIG. 3. In FIG. 3(*a*), an electric field buffer layer 31 is composed of plural continuous circular p-type terminations 31*a* to 31*c*. In these p-type terminations 31*a* to 31*c*, the impurity concentrations are different from one another. In an embodiment, the impurity concentrations are gradually decreased toward the outmost circumference. The p-type terminations 31*a* to 31*c* may have almost the same width in the radial direction as each other, or may have different widths from one another as shown in the figure wherein the width in the radial direction of the inner p-type termination 31*a* is longer. The number of the circular p-type terminations is three in the figure, but the number may be increased.

In FIG. 3(*b*), an electric field buffer layer 31 is composed of plural circular p-type terminations 31*d* to 31*g* that are separated from each other. These p-type terminations 31*d* to 31*g* may have the same or different impurity concentrations from one another. These p-type terminations 31*d* to 31*g* may have different widths in the radial direction from one another such that the width in the radial direction of the inner p-type termination 31*d* is longer as shown in the same figure. Further, the number of the circular p-type terminations is four in the figure, but the number may be increased.

Figure 4:
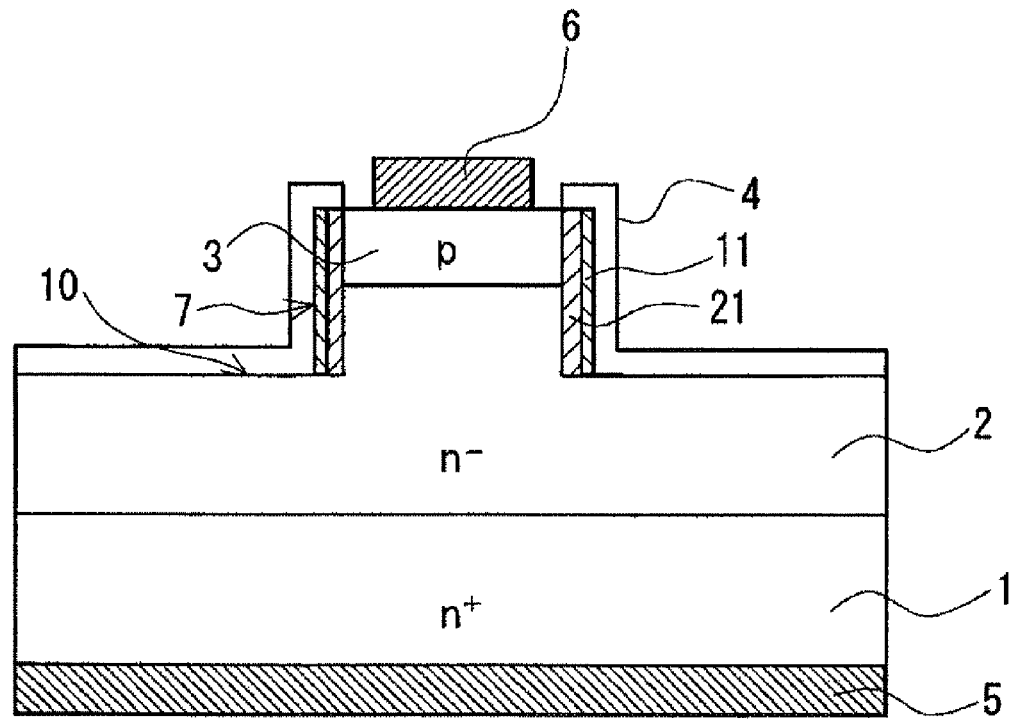
FIG. 4 is a cross-sectional view illustrating a third exemplary embodiment of a bipolar semiconductor device according to the present invention.

FIG. 4 is a cross-sectional view illustrating the third exemplary embodiment of a silicon carbide bipolar semiconductor device (pn-diode) according to the present invention. The constituent devices that appear in the above-described exemplary embodiments are shown with the same reference marks, and detailed explanation thereof is omitted.

In the present exemplary embodiment, the configuration thereof is basically similar to that in the first exemplary embodiment, but a p-type low resistance layer 11 that works as an forward-operation degradation preventing layer is formed on the mesa wall 7, and a p-type conductive layer 21 is formed adjacent to the inner side of the low resistance layer. The p-type conductive layer 21 is formed by ion implantation of boron, aluminum or the like. After the ion implantation, thermal treatment is performed at 1800° C. in an argon gas atmosphere to activate the implanted ions.

Specific examples of the dimensions, impurity concentration and others of the pn-diode according to the present exemplary embodiment are as follows:

n$^+$ substrate 1: thickness 350 μm, doping concentration $7.5 \times 10^{18}$ cm$^{-3}$, n-type drift layer 2: thickness 60 μm, doping concentration $5 \times 10^{18}$ cm$^{-3}$, p-type carrier injection layer 3: thickness 2 μm, doping concentration $3 \times 10^{18}$ cm$^{-3}$, height of mesa wall 7: 4 μm, p-type low resistance layer 11: thickness 120 nm, doping concentration $2.5 \times 10^{20}$ cm$^{-3}$, and p-type conductive layer 21: thickness 440 nm, doping concentration $1.5 \times 10^{17}$ cm$^{-3}$.

As described above, the p-type low resistance layer 11 functions as an forward-operation degradation preventing layer that separates the surface of the mesa wall 7 spatially from the pn-junction interface. By providing the p-type low resistance layer 11, recombination between electrons and holes on the surface of the mesa wall 7 is prevented. As a result, the formation and expansion of stacking faults thereof caused by the defects and roughening on the surface of the mesa wall 7 are substantially suppressed.

Further, the p-type low resistance layer 11 makes the surface potential over the entire surface of the mesa wall 7 equipotential during the application of a reverse voltage. As a result, electric field concentration caused by the defects and roughening on the surface of the mesa wall 7 is prevented, and the lowering in withstand voltage and the generation of leakage current that are caused by these defects and roughening are suppressed.

However, in the case where only the p-type low resistance layer 11 is formed on the mesa wall 7, carrier injection from the p-type low resistance layer 11 to the n-type drift layer 2 possibly occurs because the impurity concentration of the p-type low resistance layer 11 is high.

Accordingly, in the present exemplary embodiment, the p-type conductive layer 21 is provided on the inner side of the p-type low resistance layer 11, and the p-type conductive layer has an impurity concentration sufficiently lower than that of the p-type carrier injection layer 3. By this configuration, carrier injection to the silicon carbide drift layer 2 is prevented, and new crystal defects are prevented from occurring during operation.

In the case where only the p-type low resistance layer 11 is formed on the mesa wall 7, the interface between the p-type low resistance layer 11 and the n-type drift layer 2 forms a pn-junction. As a result, a depletion layer spreads from the pn-junction interface to the inside of the p-type low resistance layer 11 during the application of a reverse voltage. As a result, an electric field distribution develops inside the p-type low resistance layer 11 on the side of the pn-junction interface, and the function as an equipotential layer is possibly impaired.

However, in the present exemplary embodiment, the p-type conductive layer 21 that is appropriately controlled in thickness and impurity concentration is disposed adjacent to the inner side of the p-type low resistance layer 11, so that a depletion layer that develops during the application of a reverse voltage can be confined inside the p-type conductive layer 21 and the whole of the p-type low resistance layer 11 becomes equipotential. As a result, the function as an equipotential layer can be exhibited sufficiently.

The p-type low resistance layer 11 and the p-type conductive layer 21 are formed on the mesa wall 7 in a region ranging at least from the pn-junction interface between the n-type drift layer 2 and the p-type carrier injection layer 3 to the mesa end.

By this configuration, the pn-junction interface is separated from the surface of the mesa wall 7 by the presence of the p-type low resistance layer 11 and the p-type conductive layer 21.

Preferably, the p-type low resistance layer 11 and the p-type conductive layer 21 are formed on the mesa wall over the entire region thereof in the height direction. By this configuration, the p-type low resistance layer 11 functions as an equipotential layer during the application of a reverse voltage, so that electric field concentration on the surface of the mesa wall 7 can be prevented.

If necessary, the p-type low resistance layer 11 and the p-type conductive layer 21 may be formed continuously from the mesa wall 7 to a mesa periphery in the vicinity of the mesa wall. By this configuration, even in the mesa periphery 10 in the vicinity of the mesa end, the surface thereof is separated spatially from the pn-junction interface, so that recombination of electrons and holes is prevented on the surface of the mesa periphery 10. In addition, when a reverse voltage is applied, the entire surface of the region where the p-type low resistance layer 11 is formed in the mesa periphery 10 becomes equipotential. As a result, electric field concentration caused by the defects and roughening on the surface of the mesa periphery 10 is prevented, and the lowering in withstand voltage and the generation of leakage current that are caused by these defects and roughening are suppressed.

Figure 6:
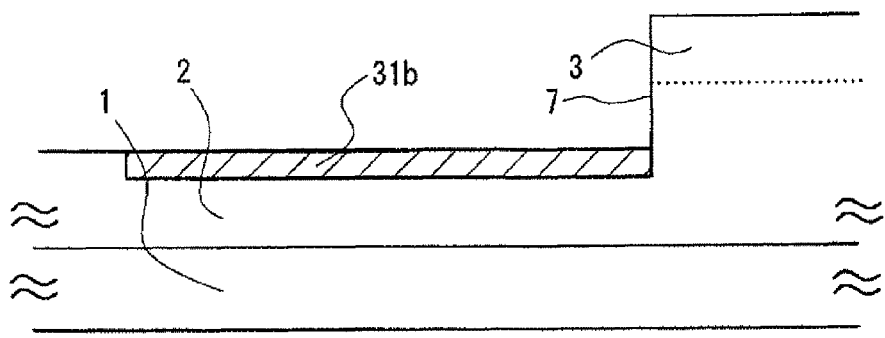
FIG. 6 is a set of cross-sectional views illustrating one specific example of a method for producing a bipolar semiconductor device of the forth exemplary embodiment.
Figure 6:
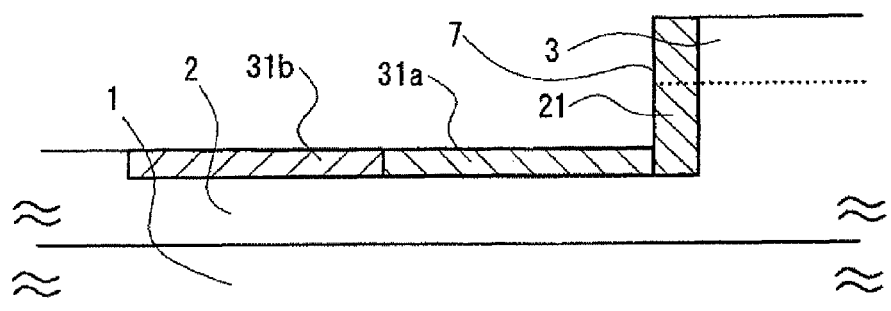
Figure 6:
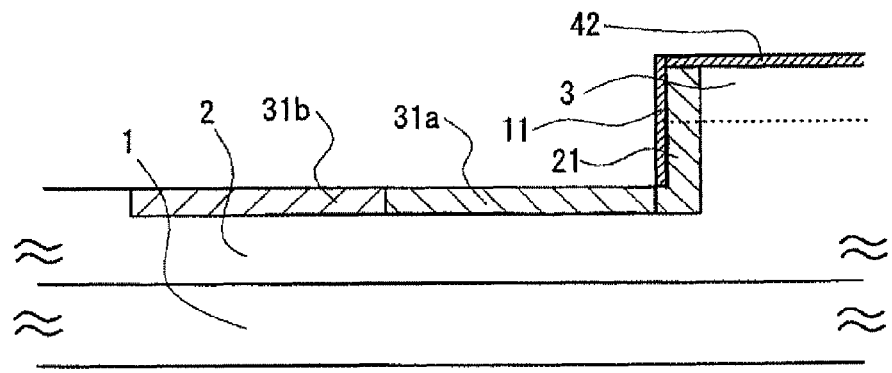
Figure 6:
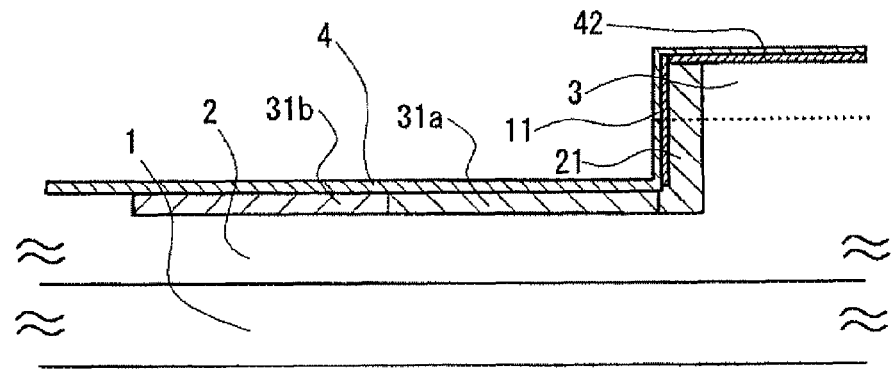

Furthermore, in the step of forming the p-type low resistance layer 11 as described later with reference to FIG. 6, the p-type low resistance layer may be formed also on the surface of the p-type carrier injection layer 3, and this p-type low resistance layer may be used as a contact layer for the anode 6.

The thickness of the p-type low resistance layer 11 is preferably from 50 nm to 500 nm, more preferably from 100 nm to 400 nm, and still more preferably from 100 nm to 200 nm.

The impurity concentration of the p-type low resistance layer 11 is preferably $10^{19}$ cm$^{-3}$ or more, more preferably from $1\times10^{19}$ cm$^{-3}$ to $1\times10^{22}$ cm$^{-3}$, and still more preferably from $1\times10^{20}$ cm$^{-3}$ to $1\times10^{21}$ cm$^{-3}$. When the impurity concentration is too low, the p-type low resistance layer 11 does not become equipotential during the application of a reverse voltage. On the other hand, when the impurity concentration is too high, new crystal defects easily develop in the course of forming the p-type low resistance layer 11.

Figure 13:
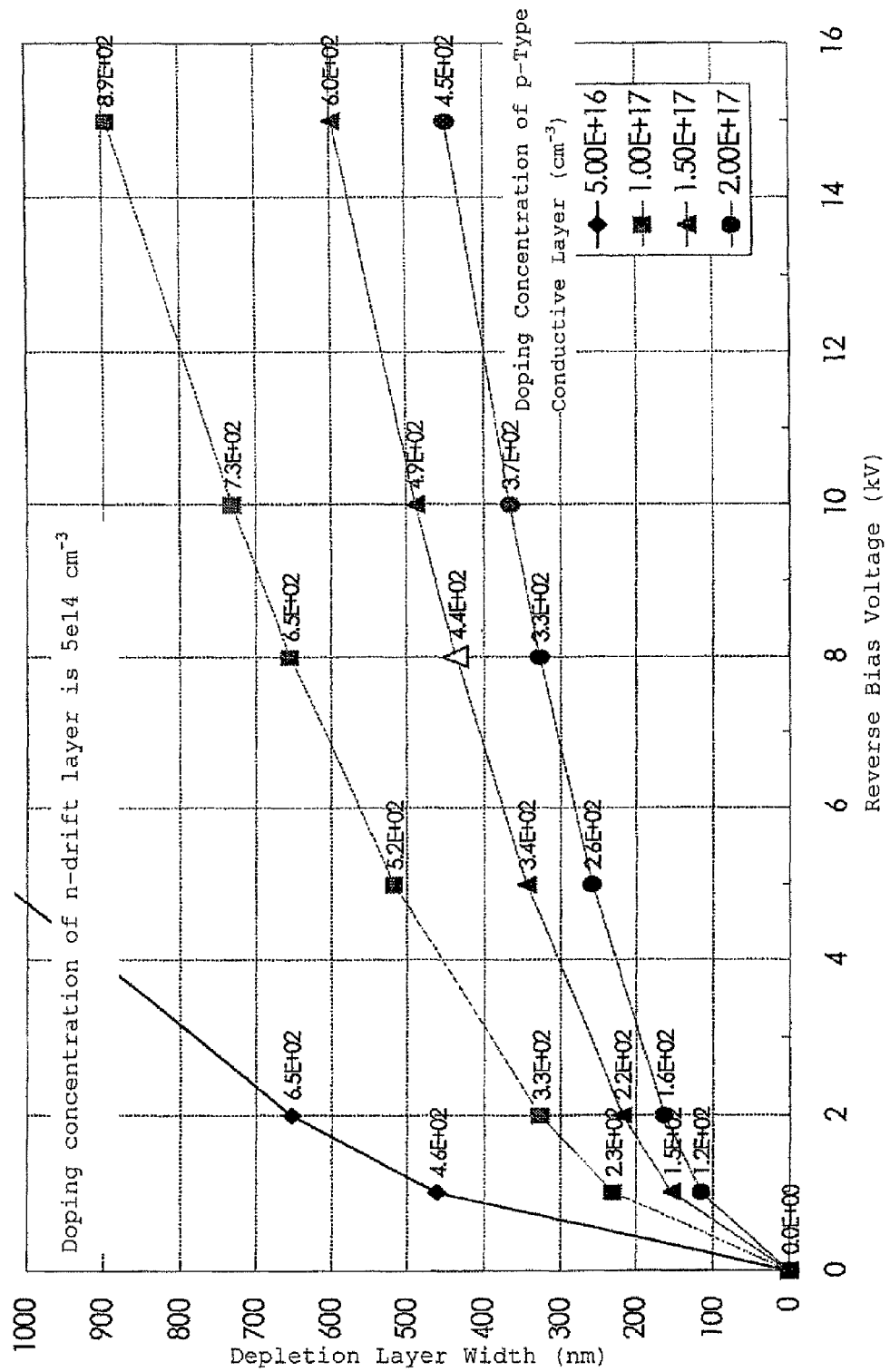
FIG. 13 is a graph illustrating relationships between a reverse voltage and a depletion layer width with respect to each doping concentration of a p-type conductive layer.
Figure 14:
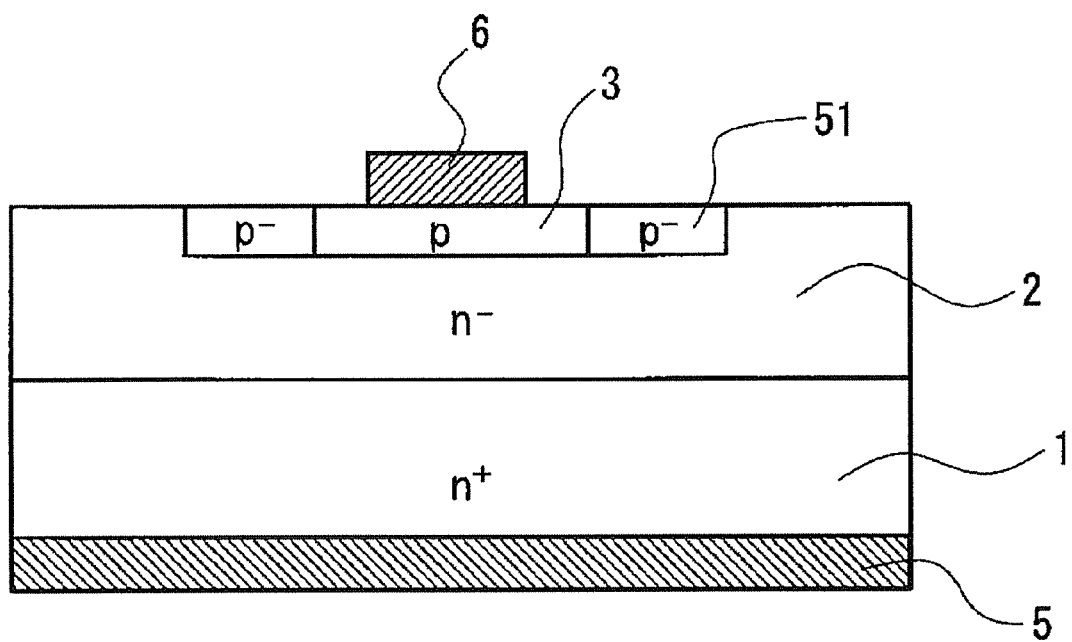
FIG. 14 is a cross-sectional view of a conventional pn-diode.
Figure 15:
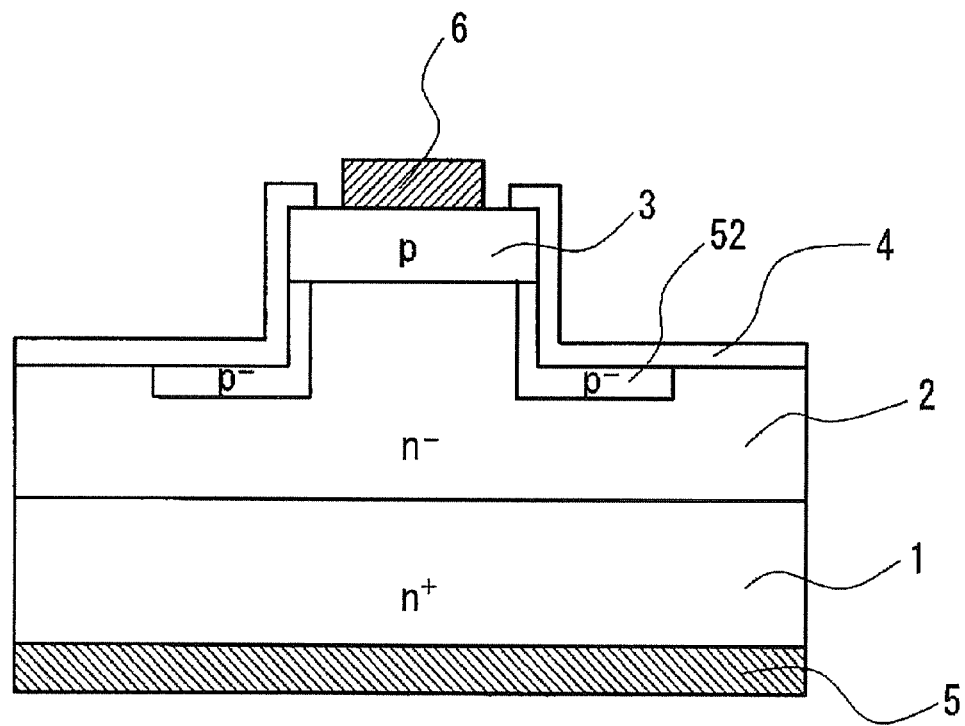
FIG. 15 is a cross-sectional view of a conventional pn-diode.
Figure 16:
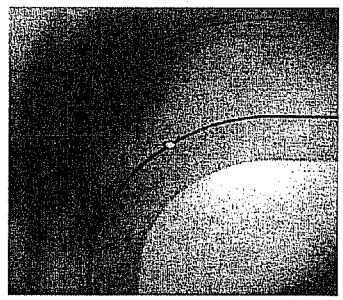
FIG. 16 is an example of observation of leakage current with an emission microscope.

The impurity concentration and thickness of the p-type conductive layer 21 should be selected such that the depletion layer formed during the application of a reverse voltage is confined inside the p-type conductive layer 21. When the depletion layer reaches the outside of the p-type conductive layer 21, that is, the p-type low resistance layer 11, a potential distribution develops inside the p-type low resistance layer 11, and the whole of the p-type low resistance layer 11 will not become equipotential. FIG. 13 shows characteristics of a reverse bias vs. depletion layer width when the impurity concentration of the p-type conductive layer 21 is changed. Considering the withstand voltage or the like, the thickness and impurity concentration of the p-type conductive layer 21 are selected such that the depletion layer width falls within an acceptable range.

The thickness of the p-type conductive layer 21 is preferably from 200 nm to 1 µm, and more preferably from 500 nm to 1 µm.

The impurity concentration of the p-type conductive layer 21 is preferably $1\times10^{18}$ cm$^{-3}$ or less, more preferably from $1\times10^{17}$ cm$^{-3}$ to $5\times10^{17}$ cm$^{-3}$, and still more preferably from $1\times10^{17}$ cm$^{-3}$ to $2\times10^{17}$ cm$^{-3}$. When the impurity concentration is too high, carriers are possibly injected from the p-type conductive layer 21 to the n-type drift layer 2. On the other hand, when the impurity concentration is too low, ions are required to be implanted deeply.

Figure 5:
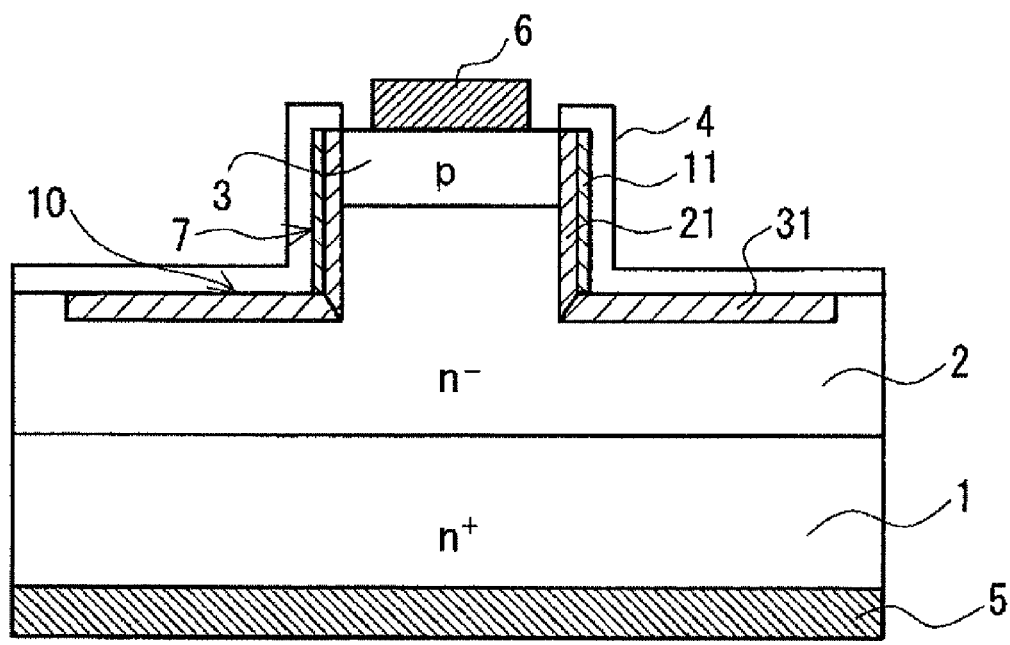
FIG. 5 is a cross-sectional view illustrating a forth exemplary embodiment of a bipolar semiconductor device according to the present invention.

FIG. 5 is a cross-sectional view illustrating the forth exemplary embodiment of a silicon carbide bipolar semiconductor device (pn-diode) according to the present invention. The constituent devices that appear in the aforementioned exemplary embodiments are shown with the same reference marks, and detailed explanation thereof is omitted.

In the present exemplary embodiment, the configuration thereof is basically similar to that in the first exemplary embodiment, but an electric field buffer layer 31 is formed in the mesa periphery 10. The electric field buffer layer 31 is formed by ion implantation of a p-type impurity.

By forming the electric field buffer layer 31, a depletion layer spreads over the region where the electric field buffer layer 31 is formed during the application of a reverse voltage. The depletion layer further enhances the performance of withstand voltage.

The electric field buffer layer 31 is formed as a circle around the mesa. Further, the electric field buffer layer 31 is preferably formed continuously from the p-type low resistance layer 11.

In one exemplary embodiment of the electric field buffer layer 31, the electric field buffer layer 31 is composed of plural circular layers that are disposed successively in a radial direction and differ from one another in p-type impurity concentration. Particularly preferably, the electric field buffer layer has a JTE (junction termination extension) structure.

As a specific example of the electric field buffer layer, there may be mentioned the structure shown in FIG. 3.

Hereinafter, with reference to FIG. 6, one example of methods for producing a pn-diode of the present exemplary embodiment will be explained.

As shown in FIG. 6(a), a n$^{+}$ substrate 1 has a thickness of 350 µm and an impurity concentration of $7.5\times10^{18}$ cm$^{-3}$, and a n-type drift layer 2 with a thickness of 60 µm and an impurity concentration of $5\times10^{14}$ cm$^{-3}$ is formed on the substrate by epitaxial growth. On this n-type drift layer 2, a p-type carrier injection layer 3 with a thickness of 2 µm and an impurity concentration of $3\times10^{18}$ cm$^{-3}$ is formed by epitaxial growth.

The n-type drift layer 2 and the p-type carrier injection layer 3 formed by epitaxial growth are etched by reactive ion etching technique to form a 4 µm high mesa.

After the mesa is formed, a thermal oxidation layer is formed on the surface of the device. Then, the thermal oxidation layer is removed to reduce surface defects of SiC.

Subsequently, aluminum is ion-implanted to form a p-type termination 31b with a depth of 400 nm from the surface and an impurity concentration of $3\times10^{17}$ cm$^{-3}$.

Then, as shown in FIG. 6(b), on a mesa wall 7 and a mesa periphery in the vicinity of the mesa wall, aluminum is ion-implanted from above at an angle to form a p-type conductive layer 21 with a depth of 640 nm from the surface of the mesa wall 7 and a doping concentration of $1.5\times10^{17}$ cm$^{-3}$. At the same time, a p-type termination 31a with a depth of 400 nm from the surface and a doping concentration of $6\times10^{17}$ cm$^{-3}$ is formed.

Next, as shown in FIG. 6(c), aluminum is ion-implanted on the mesa wall and the mesa periphery to form a p-type low resistance layer 11 with a depth of 200 nm from the surface of the mesa wall and a doping concentration of $2.5\times10^{20}$ cm$^{-3}$.

Here, by the ion-implantation from above at an angle, a p-type low resistance layer is also formed on the upper face of the mesa. This layer serves as a contact layer 42 for an anode.

After the p-type low resistance layer 11 is formed, thermal treatment is performed at 1800° C. in an argon gas atmosphere to activate the implanted ions. Thereafter, a thermal oxidation layer is formed, which serves as a passivation layer 4 (FIG. 6(d)).

The SiC crystal face of the mesa periphery is (0001) face and the crystal face of the mesa wall is (11-20) face. Therefore, the thickness of the passivation layer 4 is 40 nm at the mesa periphery and 160 nm at the mesa wall. Here, the SiC at the mesa wall is consumed to a depth of 80 nm for the formation of the oxidation layer, so that the actual thickness of the p-type low resistance layer 11 is 120 nm.

Subsequently, the passivation layer formed on the surface of the n$^+$ substrate 1 is removed, and nickel is deposited with an electron beam evaporator and then a thermal treatment is performed to form a cathode. Similarly, the passivation layer 4 formed on the surface of the p-type carrier injection layer 3 is treated to remove a portion where an anode will be formed, and aluminum, titanium or the like is deposited on the surface of the contact layer 42 with an electron beam evaporator and is then a thermal treatment is performed to form an anode.

Figure 7:
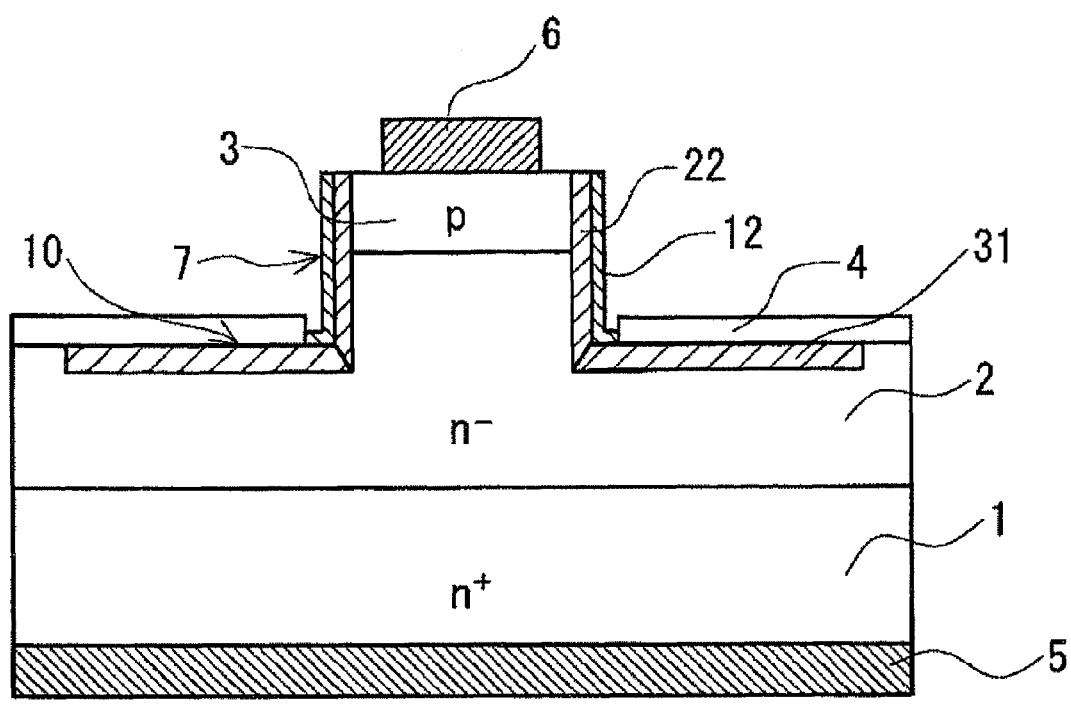
FIG. 7 is a cross-sectional view illustrating a fifth exemplary embodiment of a bipolar semiconductor device according to the present invention.

FIG. 7 is a cross-sectional view illustrating the fifth exemplary embodiment of a silicon carbide bipolar semiconductor device (pn-diode) according to the present invention. The constituent devices that appear in the aforementioned exemplary embodiments are shown with the same reference marks, and detailed explanation thereof is omitted.

In the present exemplary embodiment, the configuration thereof is basically similar to those in the above exemplary embodiments, but a p-type conductive layer 22 is formed on the whole of the mesa wall 7, and a metal layer 12 is formed on the surface of the mesa wall 7. The metal layer 12 works to make the surface potential of the entire surface of the mesa wall 7 equipotential during the application of a reverse voltage. By this configuration, electric field concentration caused by the defects and roughening on the surface of the mesa wall 7 is prevented, which suppresses the lowering in withstand voltage and the generation of leakage current that are caused by these defects and roughening.

The metal layer 12 may be formed by depositing aluminum, nickel or the like in about 10 nm thickness with an electron beam evaporator. The thickness of the metal layer 12 may be selected as appropriate in accordance with situations as long as the metal layer can make the mesa wall equipotential during the application of a reverse voltage. Further, the metal layer 12 may also cover the surface of the p-type carrier injection layer 3 and the anode.

The p-type conductive layer 22 is formed by ion implantation of boron, aluminum or the like. After the ion implantation, thermal treatment is performed at 1800° C. in an argon atmosphere to activate the implanted ions.

The p-type conductive layer 22 functions as an forward-operation degradation preventing layer that separates the surface of the mesa wall 7 spatially from the pn-junction interface. By providing the p-type conductive layer 22, recombination between electrons and holes on the surface of the mesa wall 7 is prevented. As a result, the formation and expansion of stacking faults thereof caused by the defects and roughening on the surface of the mesa wall 7 are substantially suppressed. In addition, the p-type conductive layer 22 prevents short circuits between the n-type drift layer 2 and the p-type carrier injection layer 3 through the metal layer 12. The thickness and impurity concentration of the p-type conductive layer 22 are selected considering the withstand voltage and others, namely such that the depletion layer width falls within an acceptable range during reverse biasing.

The p-type conductive layer 22 is formed in a region ranging at least from the pn-junction interface between the n-type drift layer 2 and the p-type carrier injection layer 3 to the mesa end on the mesa wall.

The p-type conductive layer 22 is preferably formed continuously from the mesa wall 7 to the mesa periphery 10 in the vicinity of the mesa wall. By this configuration, even at the mesa periphery 10 in the vicinity of the mesa end, the surface thereof is separated spatially from the pn-junction interface. As a result, recombination between electrons and holes is prevented in the surface of the mesa periphery 10.

The thickness and impurity concentration of the p-type conductive layer 22 may be selected as appropriate as long as the function is exhibited, but may be selected within a range similar to that of the p-type conductive layer 20 of the aforementioned exemplary embodiments.

In the present exemplary embodiment, an electric field buffer layer 31 is formed in the mesa periphery 10. The electric field buffer layer 31 is formed by ion implantation of a p-type impurity.

By forming the electric field buffer layer 31, a depletion layer spreads in the region where the electric field buffer layer 31 is formed during the application of a reverse voltage. The depletion layer enhances the performance of withstand voltage.

The electric field buffer layer 31 is formed as a circle around the mesa. Further, the electric field buffer layer 31 is preferably formed continuously from the p-type conductive layer 22.

In one embodiment of the electric field buffer layer 31, the electric field buffer layer 31 is composed of plural circular layers that are disposed successively in a radial direction and differ from one another in p-type impurity concentration. Particularly, the buffer layer preferably has a JTE (junction termination extension) structure.

As a specific example of the electric field buffer layer, there may be mentioned the structure shown in FIG. 3.

Figure 8:
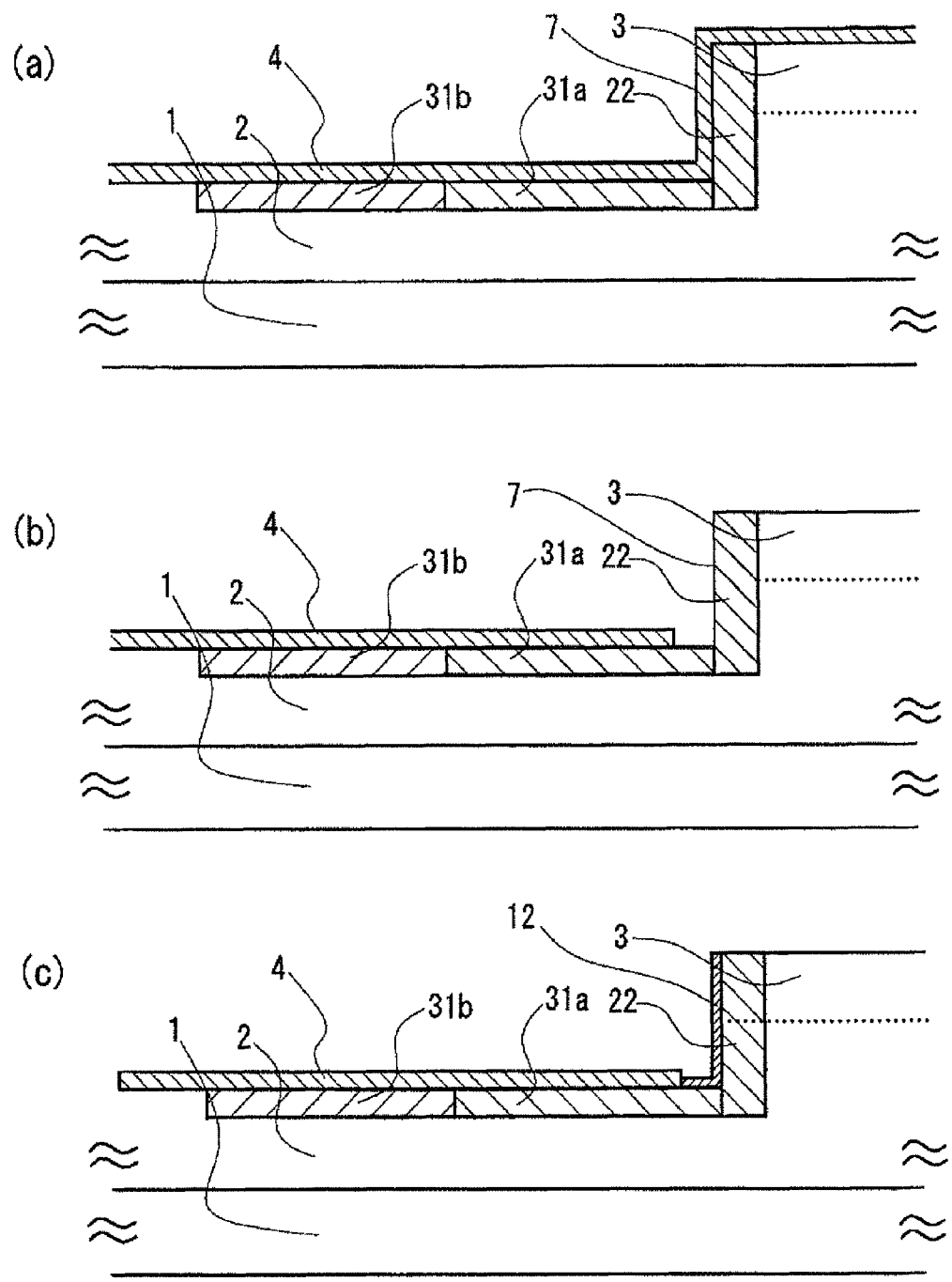
FIG. 8 is a set of cross-sectional views illustrating one specific example of a method for producing a bipolar semiconductor device of the fifth exemplary embodiment.

Hereinafter, with reference to FIG. 8, one example of methods for producing a pn-diode of the fifth exemplary embodiment will be explained. Note that the steps up to the step of forming a p-type conductive layer 22 are basically the same with the steps shown in FIG. 6(a) and FIG. 6(b). Namely, a n-type drift layer 2 and a p-type carrier injection layer 3 are formed on a n$^+$ substrate 1 by epitaxial growth, and they are etched by reactive ion etching technique to form a mesa. Then, aluminum is ion-implanted to form a p-type termination 31b. Subsequently, aluminum is ion-implanted in a mesa wall 7 and a mesa periphery in the vicinity of the mesa end to form a p-type conductive layer 22. Here, a p-type termination 31a is formed simultaneously.

Then, as shown in FIG. 8(a), a passivation layer 4 is formed on the surface of the device by thermal oxidation.

Thereafter, the passivation layer formed on the surface of the n$^+$ substrate 1 is removed, and nickel is deposited with an electron beam evaporator and then a thermal treatment is performed to form a cathode. Similarly, as shown in FIG. 8(b), the passivation layer 4 formed on the surface of the p-type carrier injection layer 3 is treated to remove a portion corresponding to the mesa surface and a part of the mesa periphery. Then, as shown in FIG. 8(c), aluminum, nickel or the like is deposited with an electron beam evaporator in about 10 nm thickness on the mesa wall and the mesa periphery where SiC is exposed, resulting in a metal layer 12. Further, on the upper face of the mesa, aluminum, titanium or the like is deposited with an electron beam evaporator and then a thermal treatment is performed to form an anode. In an embodiment, the metal layer 12 may be formed to cover the surface of the p-type carrier injection layer 3 too, in which case the metal layer 12 can also be used as an anode.

Figure 9:
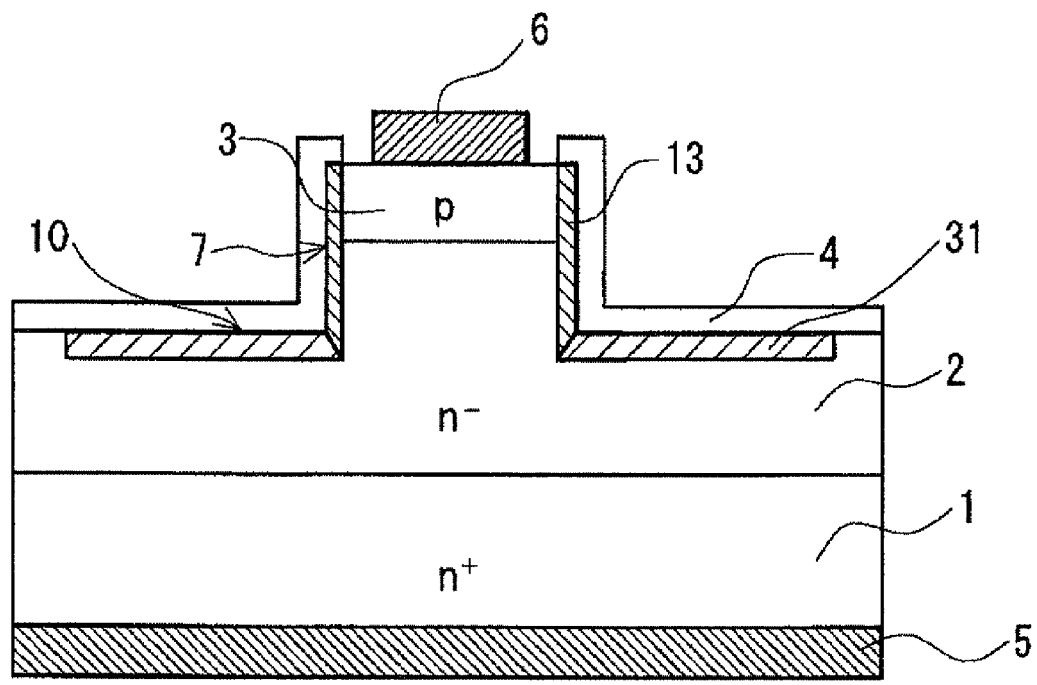
FIG. 9 is a cross-sectional view illustrating a sixth exemplary embodiment of a bipolar semiconductor device according to the present invention.

FIG. 9 is a cross-sectional view illustrating the sixth exemplary embodiment of a silicon carbide bipolar semiconductor device (pn-diode) according to the present invention. The constituent devices that appear in the aforementioned exemplary embodiments are shown with the same reference marks, and detailed explanation thereof is omitted.

In the present exemplary embodiment, the configuration thereof is basically similar to those in the aforementioned exemplary embodiments, but an amorphous layer 13 is formed on the mesa wall 7. The amorphous layer 13 is formed by transforming SiC single crystal into an amorphous (non-crystalline) state, namely, by ion-implantation of argon or the like into the mesa wall 7. The thickness of the amorphous layer 13 is not particularly limited, but is for example around 100 nm to 200 nm.

The amorphous layer 13 functions as an forward-operation degradation preventing layer that separates the surface of the mesa wall 7 spatially from the pn-junction interface. By providing the amorphous layer 13, recombination between electrons and holes on the surface of the mesa wall 7 is prevented. As a result, the formation and expansion of stacking faults thereof caused by the defects and roughening formed on the surface of the mesa wall 7 are substantially suppressed.

Since the amorphous layer 13 is of high resistance, the current flow through the surface of the mesa wall 7 during the application of a reverse voltage is suppressed by the resistance. Namely, electric field concentration generated by the defects and roughening on the surface of the mesa wall 7 is prevented, and the lowering in withstand voltage and the generation of leakage current that arise from these defects and roughening are suppressed.

If necessary, the amorphous layer 13 may be formed continuously from the mesa wall 7 to the mesa periphery 10 in the vicinity of the mesa wall. By this configuration, also in the mesa periphery 10 in the vicinity of the mesa end, the surface thereof is separated spatially from the pn-junction interface, so that recombination of electrons and holes is prevented on the surface of the mesa periphery 10. In the region where the amorphous layer 13 is formed in the mesa periphery 10, electric field concentration caused by the defects and roughening on the surface of the mesa periphery 10 is prevented during the application of a reverse voltage. As a result, the lowering in withstand voltage and the generation of leakage current that arise from these defects and roughening are prevented.

On the outer face of the amorphous layer 13, a passivation layer 4 is desirably formed.

Figure 10:
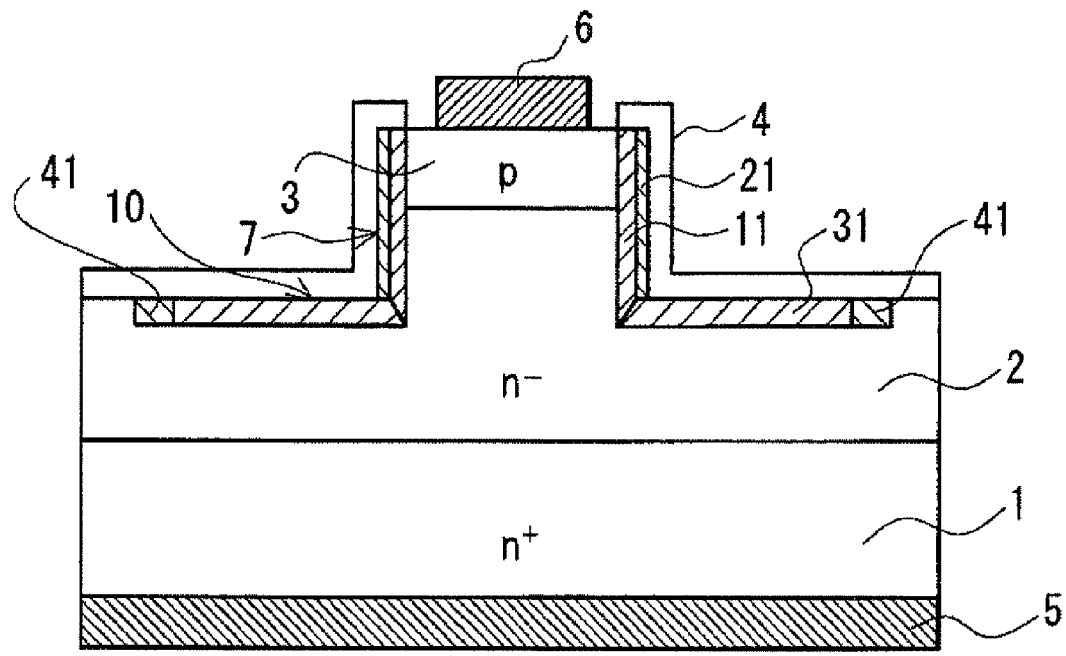
FIG. 10 is a cross-sectional view illustrating a seventh exemplary embodiment of a bipolar semiconductor device according to the present invention.

FIG. 10 is a cross-sectional view illustrating the seventh exemplary embodiment of a silicon carbide bipolar semiconductor device (pn-diode) according to the present invention. The constituent devices that appear in the aforementioned exemplary embodiments are shown with the same reference marks, and detailed explanation thereof is omitted.

In the present exemplary embodiment, the configuration thereof is basically similar to those in the aforementioned exemplary embodiments, but a circular n-type layer 41 is formed adjacent to the outer circumference of the p-type electric field buffer layer 31. This n-type layer 41 is formed by ion implantation. The doping concentration of the n-type impurity is higher than the doping concentration of the n-type drift layer 2, and is for example in the range of from $1\times10^{17}$ $cm^{-3}$ to $1\times10^{18}$ $cm^{-3}$.

Figure 11:
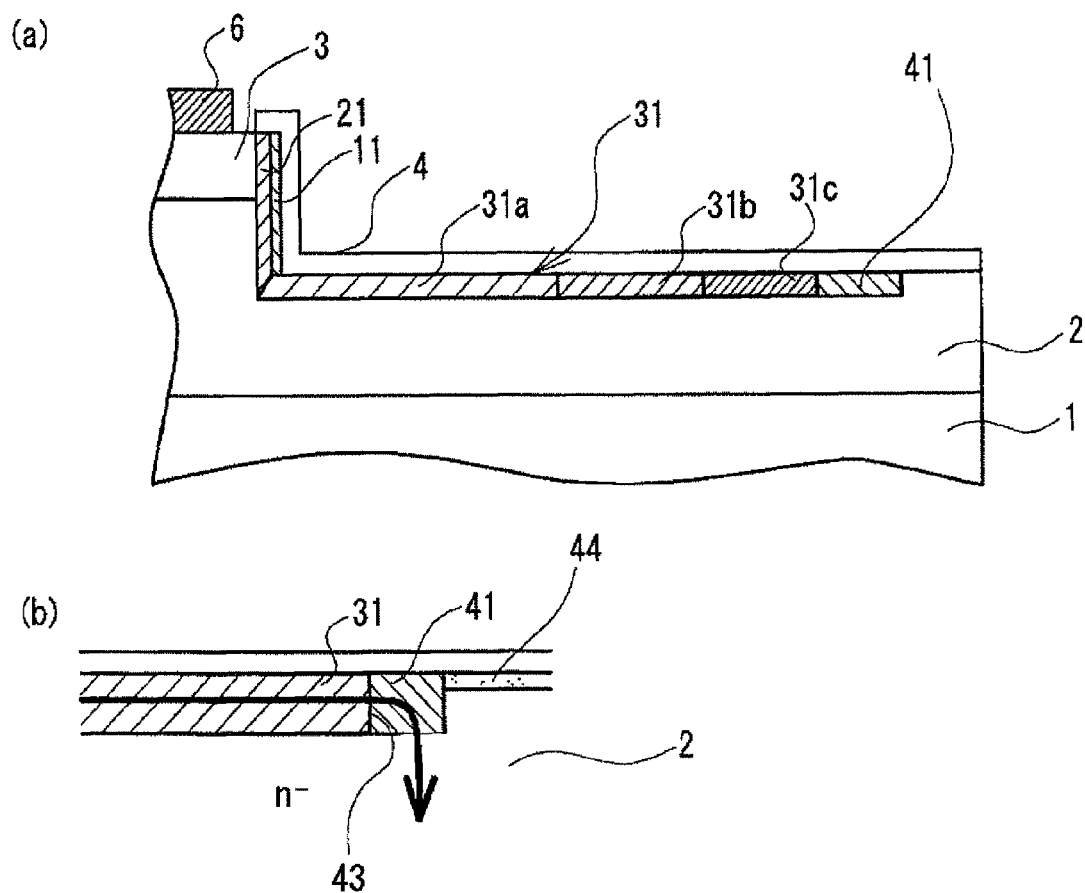
FIG. 11 is a set of cross-sectional views illustrating a periphery of a mesa in a bipolar semiconductor device of the fifth exemplary embodiment.

The electric field buffer layer 31 may be configured in various structures as explained in FIG. 3. For example, as shown in FIG. 11(a), it may be composed of p-type terminations 31a to 31c having different concentrations from one another.

Further, the mesa wall may have any structure selected from those described in the first to sixth exemplary embodiments.

By providing the n-type layer 41, as shown in FIG. 9(b), a pn-junction interface 43 that provides energy promoting the formation and expansion of stacking faults during the application of a forward current is separated spatially from a surface defect region 44 present on the surface of the mesa periphery. That is, the n-type layer 41 functions as a second forward-operation degradation preventing layer.

The current pathway is as indicated by an arrow in FIG. 9(b). A forward current passing through the pn-junction interface 43 flows from the n-type layer 41 to the n-type drift layer 2. In this way, carrier recombination does not occur in the surface defect region 44 in the mesa periphery. As a result, the formation and expansion of stacking faults that arise from the defects on the surface of the mesa periphery are suppressed.

Particular exemplary embodiments of the present invention are explained above, but it should be construed that the invention is in no way limited to those exemplary embodiments, and numerous modifications and alternate exemplary embodiments will occur within the scope of the present invention.

For example, although pn-diodes are explained in the above exemplary embodiments, the present invention can be applied to other bipolar semiconductor devices including thyristors, gate-turn-off-thyristors (GTO), insulated gate bipolar transistors (IGBT) and bipolar junction transistors (BJT).

In the exemplary embodiments, there is used a SiC substrate in which a n-type drift layer and a p-type carrier injection layer are formed on a n-type substrate. However, the conductive types thereof may be reversed, in which case the conductive type is also reversed for a SiC low resistance layer and a SiC conductive layer formed by ion implantation on the mesa wall.

The structures for enhancing the withstand voltage include JTE structures, floating ring structures and plate ring structures.

The invention claimed is:

1. A silicon carbide bipolar semiconductor device comprising:
    a silicon carbide drift layer of a first conductive type formed on a surface of a silicon carbide single crystal substrate by epitaxial growth;
    a silicon carbide carrier injection layer of a second conductive type formed on a surface of the silicon carbide drift layer by epitaxial growth;
    a mesa structure formed on an device face on the side where the silicon carbide drift layer and the silicon carbide carrier injection layer are formed; and
    a forward-operation degradation preventing layer that is formed on a mesa wall or on a mesa wall and a mesa periphery at a position that separates spatially the surface of the mesa wall of the silicon carbide bipolar semiconductor device from a pn-junction interface
    wherein the forward-operation degradation preventing layer is a silicon carbide conductive layer.

2. The silicon carbide bipolar semiconductor device according to claim 1, wherein the forward-operation degradation preventing layer is formed in a region ranging at least from the pn-junction interface to the mesa end on the mesa wall.

3. The silicon carbide bipolar semiconductor device according to claim 2, wherein the forward-operation degradation preventing layer is formed on the whole of the mesa wall in the direction of the height thereof.

4. The silicon carbide bipolar semiconductor device according to claim 1, wherein the forward-operation degradation preventing layer is formed by ion implantation.

5. The silicon carbide bipolar semiconductor device according to claim 4, wherein an inside silicon carbide conductive layer of a second conductive type that prevents carrier injection from the forward-operation degradation preventing layer to the silicon carbide drift layer is formed on the inner side of the forward-operation degradation preventing layer.

6. The silicon carbide bipolar semiconductor device according to claim 5, wherein the impurity concentration of the inside silicon carbide conductive layer is lower than the impurity concentration of the silicon carbide carrier injection layer.

7. The silicon carbide bipolar semiconductor device according to claim 6, wherein the forward-operation degradation preventing layer is a silicon carbide low resistance layer of a second conductive type that is substantially equipotential during the application of a reverse voltage.

8. The silicon carbide bipolar semiconductor device according to claim 4, wherein a metal layer is formed on a surface of the forward-operation degradation preventing layer.

9. The silicon carbide bipolar semiconductor device according to claim 8, wherein the metal layer is formed on the whole of the mesa wall in the direction of the height thereof.

10. The silicon carbide bipolar semiconductor device according to claim 4, wherein the forward-operation degradation preventing layer is an amorphous layer.

11. The silicon carbide bipolar semiconductor device according to claim 10, wherein the amorphous layer is formed on the whole of the mesa wall in the direction of the height thereof.

12. The silicon carbide bipolar semiconductor device according to claim 1, wherein an electric field buffer layer of a second conductive type is formed in the mesa periphery.

13. The silicon carbide bipolar semiconductor device according to claim 12, wherein the electric field buffer layer is formed continuously from the forward-operation degradation preventing layer.

14. The silicon carbide bipolar semiconductor device according to claim 13, wherein the electric field buffer layer is composed of a plurality of circular layers that are disposed successively in a radial direction and differ from one another in concentration of an impurity of a second conductive type.

15. The silicon carbide bipolar semiconductor device according to claim 12, wherein the electric field buffer layer has a JTE, junction termination extension, structure.

16. The silicon carbide bipolar semiconductor device according to claim 12, wherein a second forward-operation degradation preventing layer of a first conductive type is formed adjacent to an outer circumference of the electric field buffer layer by ion implantation.

17. The silicon carbide bipolar semiconductor device according to claim 2, wherein the forward-operation degradation preventing layer is formed by ion implantation.

18. The silicon carbide bipolar semiconductor device according to claim 3, wherein the forward-operation degradation preventing layer is formed by ion implantation.

19. The silicon carbide bipolar semiconductor device according to claim 13, wherein the electric field buffer layer has a JTE, junction termination extension, structure.

20. The silicon carbide bipolar semiconductor device according to claim 14, wherein the electric field buffer layer has a JTE, junction termination extension, structure.

* * * * *

UNITED STATES PATENT AND TRADEMARK OFFICE
CERTIFICATE OF CORRECTION

| | | |
|---|---|---|
| PATENT NO. | : 8,154,026 B2 | Page 1 of 1 |
| APPLICATION NO. | : 12/097019 | |
| DATED | : April 10, 2012 | |
| INVENTOR(S) | : Ryosuke Ishii et al. | |

It is certified that error appears in the above-identified patent and that said Letters Patent is hereby corrected as shown below:

Column 16, Line 58, Claim 1, delete "interface" and insert -- interface, --

Signed and Sealed this
Twenty-fourth Day of July, 2012

David J. Kappos
*Director of the United States Patent and Trademark Office*